(12) United States Patent
Lin et al.

(10) Patent No.: US 6,804,140 B2
(45) Date of Patent: Oct. 12, 2004

(54) CAPACITANCE SENSING METHOD OF READING A FERROELECTRIC RAM

(75) Inventors: Chin-Hsi Lin, Hsinchu (TW); Chi-Ming Weng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 13 days.

(21) Appl. No.: 10/412,358

(22) Filed: Apr. 11, 2003

(65) Prior Publication Data

US 2003/0202394 A1 Oct. 30, 2003

(30) Foreign Application Priority Data

Apr. 17, 2002 (TW) .................................. 91107883 A

(51) Int. Cl.[7] .............................................. G11C 11/22
(52) U.S. Cl. ..................................... 365/145; 365/149
(58) Field of Search ................................ 365/145, 149, 365/190

(56) References Cited

U.S. PATENT DOCUMENTS

| | | | | |
|---|---|---|---|---|
| 5,572,459 A | * | 11/1996 | Wilson et al. | 365/145 |
| 6,229,730 B1 | * | 5/2001 | Kato | 365/145 |
| 6,731,530 B2 | * | 5/2004 | Miwa et al. | 365/145 |
| 6,731,554 B1 | * | 5/2004 | Jacob et al. | 365/201 |

FOREIGN PATENT DOCUMENTS

TW 480483 3/2003 ........... G11C/11/22

* cited by examiner

Primary Examiner—Tan T. Nguyen
(74) Attorney, Agent, or Firm—Thomas, Kayden, Horstemeyer & Risley

(57) ABSTRACT

A capacitance sensing method of reading a FeRAM (Ferroelectric Random Access Memory). First, enable the word line for turning on the first and the second switches. Then, enable the latch sense amplifier for changing the voltages of the bit line and the inverse bit line according to the first and the second ferroelectric capacitors. Then, output the data stored in the FeRAM according to the voltage difference between the bit line and the inverse bit line.

6 Claims, 4 Drawing Sheets

CAPACITANCE SENSING METHOD OF READING A FERROELECTRIC RAM

This application claims the benefit of Taiwan application Ser. No. 91107883, filed Apr. 17, 2002.

BACKGROUND OF THE INVENTION

1. Field of the Invention

The invention relates in general to a method of reading a ferroelectric RAM (FeRAM), and more particularly to a method of reading a FeRAM by capacitance sensing.

2. Description of the Related Art

The ferroelectric random access memory (FeRAM) uses ferroelectric capacitors as storage media. The ferroelectric capacitor can be polarized in either positive polarized state or negative polarized state, which represents the data stored therein. FIG. 1 is the transition diagram of the polarized state of the ferroelectric capacitor. The transition curve of the polarized state is hysteretic, which means that a positive voltage is required to convert the negative state into the positive state, and a negative voltage is required to convert the positive state into the negative state. The FeRAM has the potential to replace the current flash memory because no power is needed for the ferroelectric capacitor to maintain its polarized state. The FeRAM also has the potential to replace the current dynamic random access memory (DRAM) because only low voltage is required for changing of the polarized state of the ferroelectric capacitor.

The variable capacitance of the ferroelectric capacitor is another characteristic thereof. It is well known that the capacitance $C=\Delta Q/\Delta V$, wherein Q is the electric charge, and V is the voltage of the capacitor. The capacitance C is in proportion to the slope of the transition curve because the polarized state P is in proportion to the change in electric charge Q. Therefore, the capacitance C becomes larger if the slope of the transition curve becomes steeper. Accordingly, the capacitance in the transition state is larger than that in the stable state.

FIG. 2A is a diagram of a memory cell of a FeRAM. The memory cell is of a 1T1C type, which means the memory cell includes a transistor T and a ferroelectric capacitor Cf. The capacitor Cf is coupled between the bit line BL and the plate line PL. The voltage of the capacitor Cf is the voltage difference between the plate line PL and the bit line BL when the word line (WL) is enabled. FIG. 2B is a diagram of a memory cell of another FeRAM. The memory cell is of a 2T2C type, which means the memory cell includes 2 transistors, T and T', and two ferroelectric capacitors, Cf and Cf'. The memory cell also includes a sense amplifier SA for amplifying the voltage difference between the bit line BL and BL'so as to read the data stored in the memory cell. In addition, the bit line with higher voltage is pulled to the high level and the bit line with lower voltage is pulled to the low level by the sense amplifier SA. The sense amplifier SA is enabled according to a sensing enable signal SAE.

Two reading methods of the FeRAM are used in general: the plate-line driving method and the bit-line driving method. FIG. 3 is a timing diagram of reading the FeRAM in FIG. 2B by the plate-line driving method. Initially, the word line WL in period T1 is enabled to turn on the transistors T and T'. Then, the plate line PL is enabled and pulled high. The polarized state P and P' of the capacitor Cf and Cf', respectively, are positive as shown in FIG. 3 according to the positive voltages of the capacitors Cf and Cf'. The capacitance of the capacitor Cf' is larger than that of the capacitor Cf because the polarized state of the ferroelectric capacitor Cf is in transition phase from the negative state to the positive state. Then, the sense amplifier SA in period T3 is enabled to amplify the voltage difference between the bit line BL and BL' for reading the stored data. At this time, the bit line BL' is pulled high because the voltage thereof is higher than that of the bit line BL, and thus the bit line BL is pulled low. The voltage of the capacitor Cf is almost zero because the voltages of the bit line BL' and the plate line PL are high, and thus the polarized state P is positive, as shown in FIG. 3. The periods T1 and T2 are of the driving procedure for differentiating the voltage difference between the bit lines BL and BL'. The period T3 is of the sensing procedure.

The polarized state P' of the capacitor Cf' is positive in period T3, but the initial polarized state P' is negative at period T1. Thus, a recovery procedure is performed for the recovery of the polarized state P'. First, plate line PL in period T4 is disabled. The polarized state P' becomes negative because the voltage of the capacitor Cf' becomes negative. Then, the voltage of the capacitor Cf' becomes zero because the voltage of the bit line BL falls, and the recovery procedure is completed.

The plate-line driven method generates the voltage difference between the bit lines BL and BL' according to the polarized states of the capacitors Cf and Cf' by first enabling the plate line PL and the word line WL. The bit-line driven method generates the voltage difference between the bit lines BL and BL' according to the polarized states of the capacitors Cf and Cf' by first enabling the bit lines BL and BL', which is well known and not described here.

However, the reading speed of the prescribed plate-line driven method and the bit-line driven method are not quick enough because both of the methods each require three procedures: driving, sensing, and recovery, which needs 5 periods in total.

SUMMARY OF THE INVENTION

It is therefore an object of the invention to provide an improved and simplified method of reading a FeRAM more quickly.

The invention achieves the above-identified object by providing a capacitance sensing method of reading a FeRAM (Ferroelectric Random Access Memory). The FeRAM includes a word line, a bit line, an inverse bit line, a first switch, a second switch, a first ferroelectric capacitor, a second ferroelectric capacitor, a plate line, and a latch sense amplifier. The bit line, the first switch, the first ferroelectric capacitor, and the plate line are connected serially. The inverse bit line, the second switch, the second ferroelectric capacitor, and the plate line are connected serially. The word line switches the first and the second switches. The latch sense amplifier is coupled to the bit line and the inverse bit line. The method includes the following steps. First, turning on the first and the second switches by enabling the word line. Then, changing the voltages of the bit line and the inverse bit line by enabling the latch sense amplifier according to the first and the second ferroelectric capacitors. Then, the data stored in the FeRAM is outputted according to the voltage difference between the bit line and the inverse bit line.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
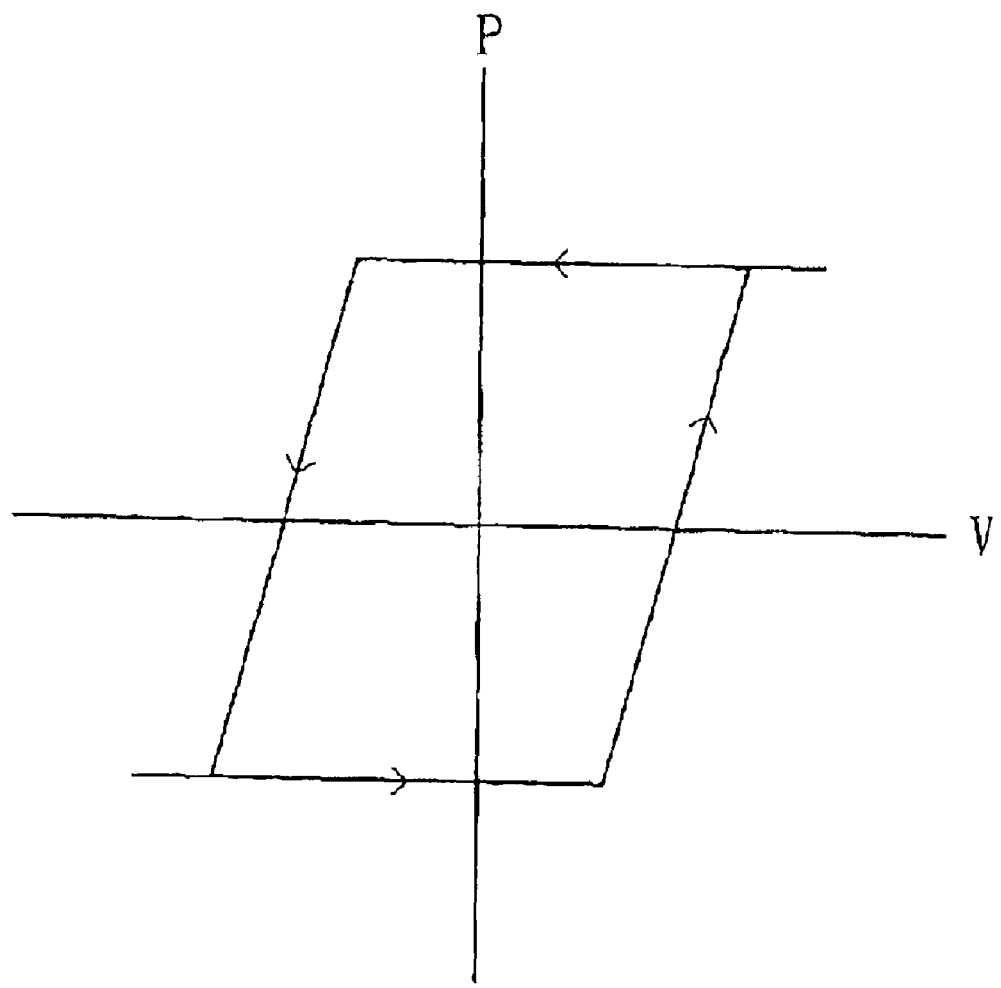
FIG. 1 (Prior Art) is the transition diagram of the polarized state of a ferroelectric capacitor.
Figure 2A:
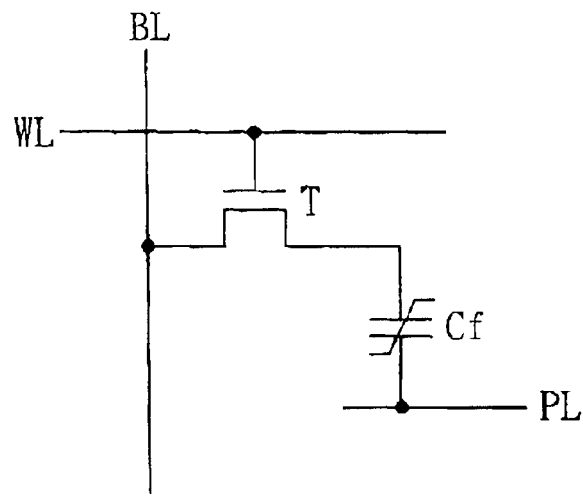
FIG. 2A (Prior Art) is a diagram of a memory cell of a FeRAM.
Figure 2B:
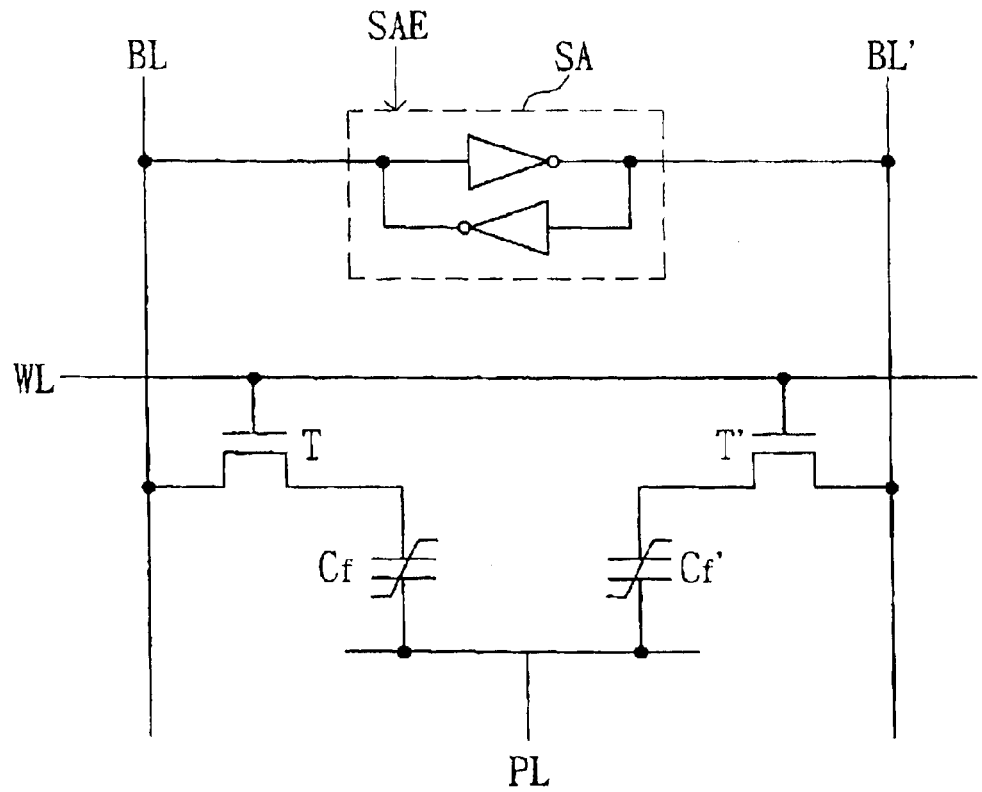
FIG. 2B (Prior Art) is a diagram of a memory cell of another FeRAM.
Figure 3:
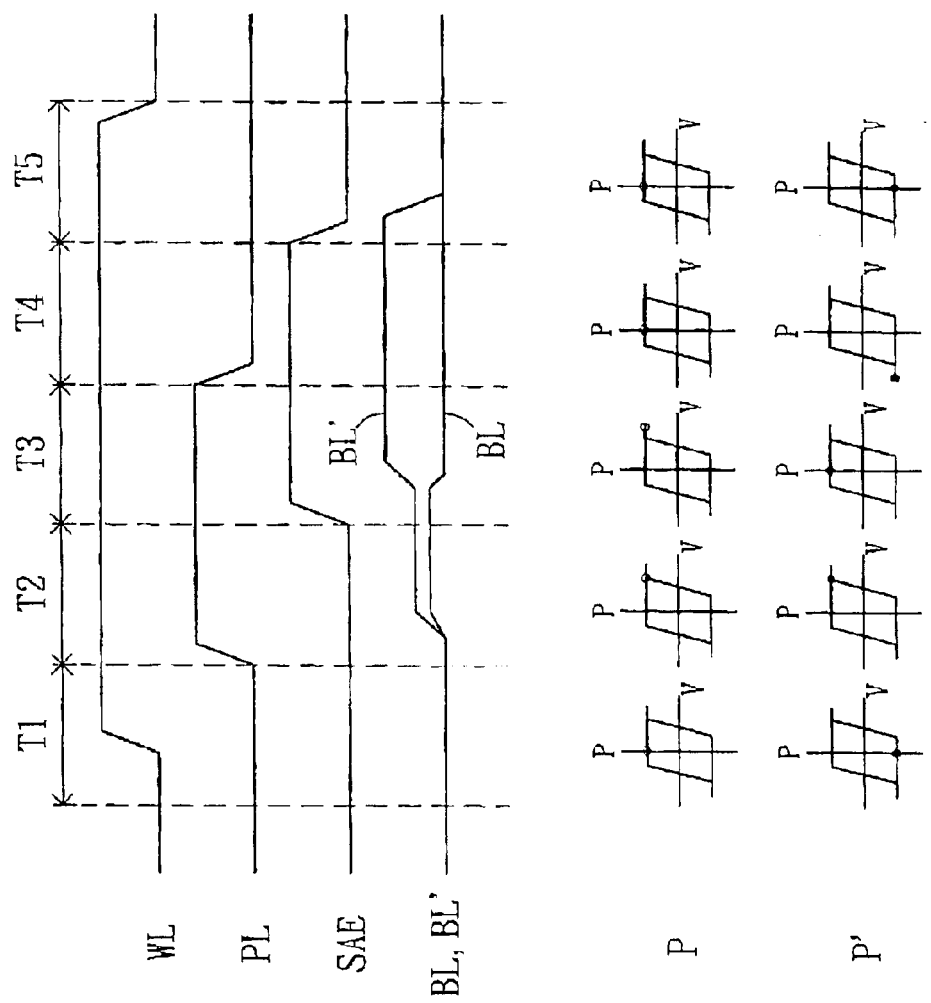
FIG. 3 (Prior Art) is a timing diagram of reading the FeRAM in FIG. 2B by the plate-line driven method.
Figure 4:
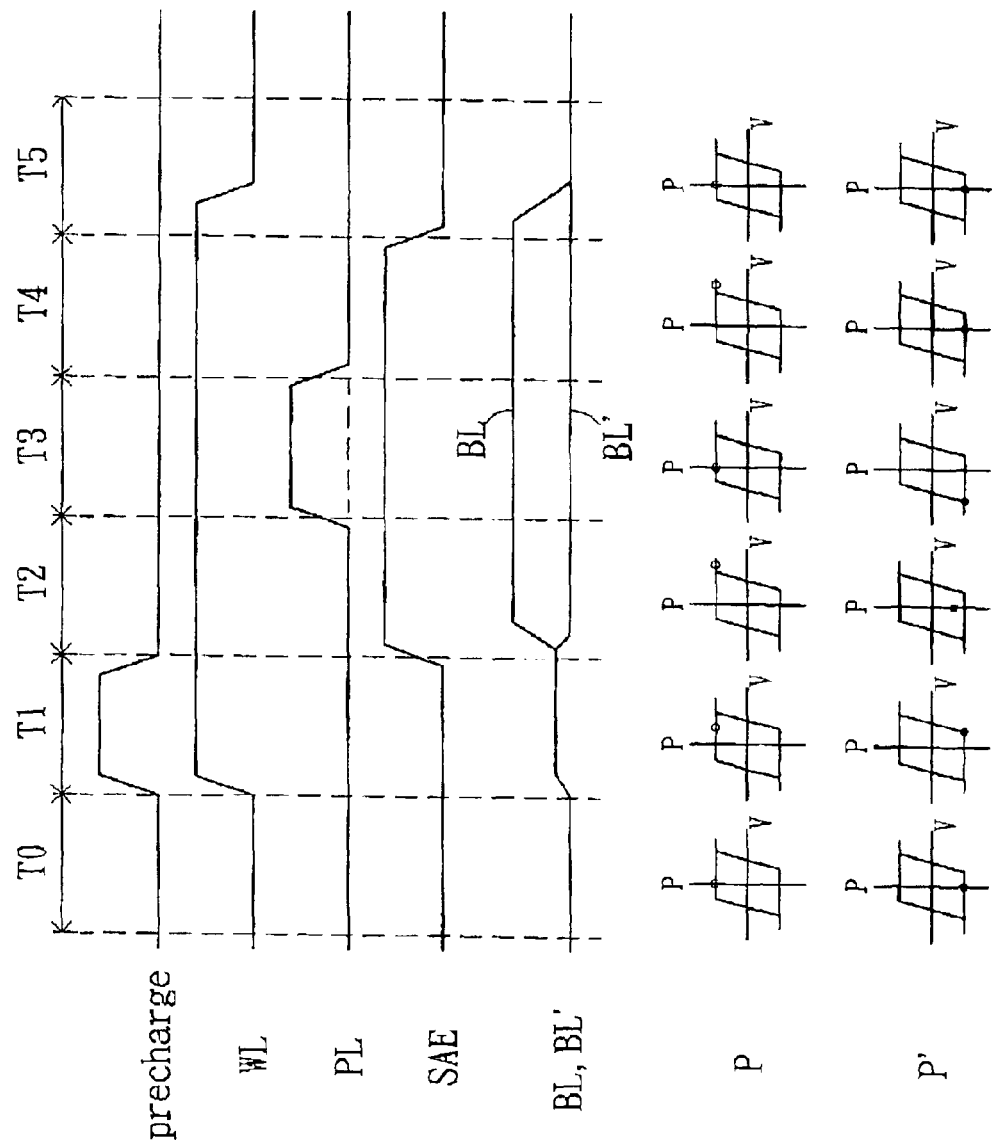
FIG. 4 is a timing diagram of the capacitance sensing method for reading a ferroelectric RAM (FeRAM) according to an embodiment of the invention.

FIG. 4 is a timing diagram of the capacitance sensing method for reading a ferroelectric RAM (FeRAM) according to the embodiment of the invention. The method is used to read the FeRAM of 2T2C type. Initially, the polarized state P and P' are positive and negative respectively, for example. First, the bit lines BL and BL' are pre-charged to increase the voltages thereof slightly at period T1. At the same time, the word line WL is enabled for turning on the transistors T and T' for amplifying the capacitance difference between the ferroelectric capacitors Cf and Cf'. The capacitor in the transition state has larger capacitance as described above. Then, the latch sense amplifier SA is enabled for amplifying the voltage difference between bit lines BL and BL' according to the capacitance of the capacitors Cf and Cf' in period T2, and the data stored is outputted according to the voltage difference. In this example, the voltage of the bit line BL is increased to the high level, and the bit line BL' is decreased to the low level by the sense amplifier SA. The capacitance of the capacitor Cf' is larger than that of the capacitor Cf because the capacitor Cf' is in the transition-state. Since the voltage of the capacitor with smaller capacitance rises more quickly, the bit line BL', coupled to the capacitor Cf', is pulled low and the bit line BL is pulled high. The invention is notably non-destructive because the polarized sates of the capacitors do not change after the stored data is read in period T2. In addition, the polarized state P' in period T2 is slighter higher than the polarized state P' in the initiation period because the relaxation of the ferroelectric capacitor, which can be recovered by the following recovery procedure.

The recovery procedure includes the following steps. First, plate line PL is enabled in period T3. The voltage of the capacitor Cf thus becomes almost zero and the voltage of the capacitor becomes negative so that the polarized states P and P' are changed. Then, plate line PL is disabled in period T4. The voltage of the capacitor Cf is positive, the voltage of the capacitor Cf' is zero, and thus the polarized states P and P' are changed. Then, sense amplifier SA and the word line WL at period T5 are disabled. The polarized states P and P' are accordingly recovered to the initial states as in period T0.

The traditional reading methods each has at least three procedures: driving, sensing, and recovery. The invention uses sense amplifier SA to sense the capacitance difference directly, instead of differentiating the voltages of the bit lines as in the traditional method. Therefore, the reading speed of the invention is higher than that of the traditional methods. In addition, the recovery procedure is not essential because the reading method of the invention is non-destructive if the ferroelectric capacitor does not have the relaxation characteristic. The precharging step in period T1 also can be skipped for speeding up the reading.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitance sensing method of reading a FeRAM (Ferroelectric Random Access Memory), the FeRAM including a word line, a bit line, an inverse bit line, a first switch, a second switch, a first ferroelectric capacitor, a second ferroelectric capacitor, a plate line, and a latch sense amplifier, wherein the bit line, the first switch, the first ferroelectric capacitor, and the plate line are connected serially, the inverse bit line, the second switch, the second ferroelectric capacitor, and the plate line are connected serially, the word line is used for switching the first and the second switches, and the latch sense amplifier is coupled to the bit line and the inverse bit line, the method comprising:

turning on the first and the second switches by enabling the word line;

changing the voltages of the bit line and the inverse bit line according to the first and the second ferroelectric capacitors by enabling the latch sense amplifier; and outputting the data stored in the FeRAM according to the voltage difference between the bit line and the inverse bit line.

2. The method according to claim 1, wherein before the turning step, the following step is processed:

precharging the bit line and the inverse bit line.

3. The method according to claim 1, wherein the method further comprises:

performing a recovery procedure, the recovery procedure comprising the steps of:
   enabling the plate line;
   disabling the plate line; and
   disabling the latch sense amplifier.

4. A capacitance sensing method of reading a FeRAM (Ferroelectric Random Access Memory), the FeRAM including a word line, a bit line, an inverse bit line, a first switch, a second switch, a first ferroelectric capacitor, a second ferroelectric capacitor, a plate line, and a latch sense amplifier, wherein the bit line, the first switch, the first ferroelectric capacitor, and the plate line are connected serially, the inverse bit line, the second switch, the second ferroelectric capacitor, and the plate line are connected serially, the word line is used for switching the first and the second switches, and the latch sense amplifier is coupled to the bit line and the inverse bit line, the method comprising the steps of:

precharging the bit line and the inverse bit line;

turning on the first and the second switches by enabling the word line; and changing the voltages of the bit line and the inverse bit line according to the first and the second ferroelectric capacitors by enabling the latch sense amplifier;

outputting the data stored in the FeRAM according to the voltage difference between the bit line and the inverse bit line.

5. The method according to claim 4, wherein the method further comprises performing a recovery procedure, and the recovery procedure comprises:

enabling the plate line;
   disabling the plate line; and
   disabling the latch sense amplifier.

6. A capacitance sensing method of reading a FeRAM (Ferroelectric Random Access Memory), the FeRAM including a word line, a bit line, a inverse bit line, a first switch, a second switch, a first ferroelectric capacitor, a second ferroelectric capacitor, a plate line, and a latch sense amplifier, wherein the bit line, the first switch, the first ferroelectric capacitor, and the plate line are connected serially, the inverse bit line, the second switch, the second ferroelectric capacitor, and the plate line are connected serially, the word line is used for switching the first and the second switches, and the latch sense amplifier is coupled to the bit line and the inverse bit line, the method comprising the steps of:

pre-charging the bit line and the inverse bit line;

turning on the first and the second switches by enabling the word line;

changing the voltages of the bit line and the inverse bit line according to the first and the second ferroelectric capacitors by enabling the latch sense amplifier;

outputting the data stored in the FeRAM according to the voltage difference between the bit line and the inverse bit line;

enabling the plate line;

disabling the plate line; and disabling the latch sense amplifier.

\* \* \* \* \*